United States Patent [19]

Kudo et al.

[11] 4,164,486

[45] Aug. 14, 1979

[54] RADIATION-CURABLE PREPOLYMER

[75] Inventors: Kin-ichi Kudo, Chiba; Katsuyoshi Nakamura; Takatoshi Tazawa, both of Ichihara, all of Japan

[73] Assignee: Dainippon Ink & Chemicals, Inc., Tokyo, Japan

[21] Appl. No.: 866,343

[22] Filed: Jan. 3, 1978

[51] Int. Cl.$^2$ .................. C09D 3/64; C09D 3/66; C09D 3/68

[52] U.S. Cl. .................. 260/22 TN; 204/159.16; 204/159.19; 260/22 D

[58] Field of Search .................. 260/22 TN, 22 D; 204/159.16, 159.19

[56] References Cited

U.S. PATENT DOCUMENTS

| | | | |
|---|---|---|---|
| 3,012,987 | 12/1961 | Ansul | 260/22 D |
| 3,256,304 | 6/1966 | Fischer et al. | 260/22 TN |
| 3,673,140 | 6/1972 | Ackerman et al. | 260/22 TN |
| 3,713,864 | 1/1973 | Ackerman et al. | 260/22 TN |
| 3,781,214 | 12/1973 | Nemoto et al. | 260/22 TN |
| 3,816,365 | 6/1974 | Schmid et al. | 260/22 D |
| 3,882,187 | 5/1975 | Takiyama et al. | 204/159.19 |
| 3,891,523 | 6/1975 | Hisamatsu et al. | 260/22 TN |
| 3,928,299 | 12/1975 | Rosenkranz et al. | 260/22 TN |
| 4,025,407 | 5/1977 | Chang et al. | 260/22 TN |
| 4,026,850 | 5/1977 | Frank et al. | 260/22 D |
| 4,035,320 | 7/1977 | Lawson | 260/22 D |
| 4,064,026 | 12/1977 | Kaufman | 204/159.19 |
| 4,066,591 | 1/1978 | Scriven et al. | 204/159.19 |

FOREIGN PATENT DOCUMENTS

1333045  10/1973  United Kingdom ................ 204/159.19

*Primary Examiner*—Ronald W. Griffin
*Attorney, Agent, or Firm*—Sherman & Shalloway

[57] ABSTRACT

A substantially NCO-free radiation-curable prepolymer which is the reaction product of (A) an organic diisocyanate with (B) a hydroxyl-containing unsaturated monomer and (C) a polyester polyol containing 2 to 8 hydroxyl groups per molecule, the polyester polyol (C) having a number average molecular weight of 400 to 6,000 and a hydroxyl equivalent weight of 200 to 3,000 and containing a dimer acid residue derived from 9 to 70%, based on the weight of the total weight of the starting materials, of dimer acid and an alcohol residue derived from 20 to 75%, based on the total weight of the starting materials, of an ethylene oxide or propylene oxide adduct of bisphenol A with the proportion of the oxide added being 2 to 4 moles.

6 Claims, No Drawings

RADIATION-CURABLE PREPOLYMER

This invention relates to a radiation-curable prepolymer having superior adhesion to a substrate, especially a metal substrate, and its application.

Attempts have been made actively to use radiation-curable prepolymers as base resins for paints, printing inks and adhesives, and some have already gained commercial acceptance.

When a radiation-curable prepolymer coated on a substrate is cured by radiation such as ultraviolet light, the curing reaction is completed within very short periods of time, causing a strain within the coating. This results in a reduction in the adhesion of the coating to the substrate. In an attempt to increase the adhesion of the radiation-curable prepolymer, it has been the previous practice to blend the radiation-curable prepolymer with a resin which does not directly participate in the polymerization reaction, such as an epoxy resin, a polyester resin, polyvinyl butyral, a polymethacrylate, or a polyacrylate. However, the blending does not essentially improve the radiation-curable prepolymer, and cannot give rise to a sufficient increase in its adhesion, but rather, reduces the curability and solvent resistance of the prepolymer.

It is an object of this invention therefore to provide a new radiation-curable prepolymer having superior adhesion to a substrate, especially a metal substrate, good curability, and good chemical and physical properties.

According to this invention, there is provided a substantially NCO-free radiation-curable prepolymer which is the reaction product of (A) an organic diisocyanate with (B) a hydroxyl-containing unsaturated monomer and (C) a polyester polyol containing 2 to 8, preferably 2 to 4, hydroxyl groups per molecule, the polyester polyol (C) having a number average molecular weight of 400 to 6,000, preferably 800 to 3,000 and a hydroxyl equivalent weight of 200 to 3,000, preferably 400 to 1,500, and containing a dimer acid residue derived from 9 to 70%, preferably 9 to 45%, based on the total weight of the starting materials, of dimer acid and an alcohol residue derived from 20 to 75%, based on the total weight of the starting materials, of an ethylene oxide or propylene oxide adduct of bisphenol A with the proportion of the oxide added being 2 to 4 moles.

Suitable organic diisocyanates (A) are aromatic, alicyclic and aliphatic diisocyanates, and include for example tolylene diisocyanate, xylylene diisocyanate, isophorone diisocyanate, hexamethylene diisocyanate, 4,4'-diphenylmethane diisocyanate, 4,4'-dicyclohexylmethane diisocyanate, and 2,2',4-trimethylhexamethylene diisocyanate.

The hydroxyl-containing unsaturated monomer (B) denotes a low-molecular-weight compound containing both a hydroxyl group and a polymerizable double bond. Examples are hydroxyalkyl (meth)acrylates such as $\beta$-hydroxyethyl (meth)acrylate, $\beta$-hydroxypropyl (meth)acrylate and $\beta$-hydroxylauryl (meth)acrylate; allyl glycol; and (meth)acrylic acid adduct of butyl glycidyl ether.

The polyester polyol (C) containing 2 to 8 hydroxyl groups per molecule is synthesized by a conventional esterification or trans-esterification method from an acid component and an alcohol component. Components are usually reacted at about 180° to 260° C. in the presence or absence of a catalyst. Examples of the catalyst include phosphoric acid, p-toluenesulfonic acid, alkayl phosphites, aryl phosphites, and organic metal compounds such as tetraisopropyl titanate, tetrabutyl titanate, tetraoctyl titanate, tetrabutyl zirconate and zirconium naphthenate.

In the preparation of the polyester polyol (C), a dimer acid or its dimethyl ester is used as an essential acid component. The dimer acid and its dimethyl ester are commercially available, and as is well known, are prepared by the dimerization of a $C_{13}$-tall oil fatty acid or its dimethyl ester. They contain less than 25% by weight of a trimer or a monomer. Hence, the polyester polyol (C) contains a dimer acid residue derived from such dimer acid or its dimethyl ester. The dimer acid or its dimethyl ester can be used together with another dicarboxylic acid or its anhydride or lower alkyl ester. Suitable dicarboxylic acids for this purpose are aliphatic, alicyclic or aromatic dicarboxylic acids containing 4 to 20 carbon atoms such as maleic acid, adipic acid, fumaric acid, itaconic acid, sebacic acid, succinic acid, phthalic acid, tetrahydrophthalic acid, isophthalic acid, and terephthalic acid.

As the alcohol component of the polyester polyol (C), an ethylene oxide or propylene oxide adduct of bisphenol A (the proportion of the oxide added is 2 to 4 moles) is used. If desired, it is used together with a polyhydric alcohol containing 2 to 4 hydroxyl groups and 2 to 18 carbon atoms such as ethylene glycol, diethylene glycol, propylene glycol, dipropylene glycol, 1,3-butylene glycol, 1,4-butylene glycol, 1,6-hexanediol, neopentyl glycol, 2,2-bis(4-hydroxycyclohexyl)propane, glycerol, trimethylol propane, hexanetriol, pentaerythritol, and diglycerol.

The ethylene oxide or propylene oxide adduct of bisphenol A (with the proportion of the oxide being 2 to 4 moles) is known. However, it has not been known in the literature to use such a bisphenol A-oxide adduct as an alcohol component, together with a dimer acid (or its methyl ester) as an acid component, in the preparation of the polyester polyol (C).

The types and amounts of the acid component and the alcohol component and the degree of the reaction (esterification) of the two are selected so that the resulting polyester polyol has 2 to 8 hydroxyl groups per molecule, a number average molecular weight of 400 to 6,000, and a hydroxyl equivalent weight of 200 to 3,000.

The polyester polyol (C) is obtained by reacting (1) an acid component consisting of a dimer acid or its dimethyl ester and optionally a dicarboxylic acid with 4 to 20 carbon atoms or its anhydride or lower alkyl ester with (2) an alcohol component consisting of an ethylene oxide or propylene oxide adduct of bisphenol A (with the proportion of the oxide added being 2 to 4 moles) and optionally a polyhydric alcohol containing 2 to 4 hydroxyl groups and 2 to 18 carbon atoms. The amount of the dimer acid (or its dimethyl ester) is 9 to 70%, preferably 9 to 45%, based on the total weight of the starting materials. The amount of the bisphenol A-oxide adduct is 20 to 75%, preferably 35 to 65%, based on the total weight of the starting materials. The amount of the dimethyl ester of dimer acid is calculated as the dimer acid. The organic diisocyanate (A), the hydroxyl-containing unsaturated monomer (B) and the polyester polyol (C) are reacted by any of the methods known in the art optionally in the presence of a solvent or diluent as described below.

In a preferred embodiment of the present invention, the organic diisocyanate (A) is reacted in a first step with the hydroxyl-containing unsaturated monomer (B)

such that the ratio of the number of hydroxyl groups to that of isocyanate groups ranges between 0.4 and 0.7, preferably between 0.5 and 0.6. Then, in a second step, the NCO-containing product is reacted with the polyester polyol (C) in substantially equal gram-equivalent weights to produce a substantially NCO-free radiation-curable prepolymer.

The reaction between the NCO group and the OH group proceeds even in the absence of a catalyst, but a catalyst may be used in this reaction. Examples of such a catalyst are tertiary amines such as triethylamine or triethylenediamine; organic metal compounds such as stannous octoate, dibutyltin dilaurate and dibutyltin diacetate; tin (II) chloride; and tin (IV) chloride.

The radiation-curable prepolymer in accordance with this invention suitably has a number average molecular weight of about 1,100 to about 9,000 and 0.3 to 2.5, especially 1 to 2, polymerizable double bonds per 1000 of molecular weight. The radiation-curable prepolymer of this invention has good curability, hardness (after curing), and flexibility because it contains a crystalline portion and an amorphous portion in suitable proportions and a suitable proportion of a urethane linkage, and has a suitable degree of branching. Moreover, the radiation-curable prepolymer has good adhesion to steel plates, aluminum plates, tin plates, and various treated steel plates, especially chromium-plated steel plates.

In use, the radiation-curable prepolymer may be mixed with a solvent or diluent in order to decrease its viscosity. Mixing with a solvent or diluent may be performed before or after the preparation of the radiation-curable prepolymer. The solvent or diluent when added prior to the preparation of the prepolymer also acts as a reaction medium. Suitable solvents or diluents include, for example, acetone, methyl ethyl ketone, methyl isobutyl ketone, toluene, xylene, methanol, ethanol, isopropyl alcohol, ethylene glycol mono- and di-alkyl ethers, ethyl acetate, butyl acetate, and isobutyl acetate.

The above solvent or diluent is used to lower the viscosity of the radiation-curable prepolymer, and after the aplication of the radiation-curable prepolymer, must be removed by evaporation. Hence, the above solvent or diluent is defective in that it pollutes the air and adversely affects the working personnel, and measures are needed to avoid these adverse effects.

Reactive diluents are known to be free from the above defects. The reactive diluents are compounds having 1 or 2 polymerizable double bonds per molecule, and which have a boiling point of at least 200° C. The radiation-curable prepolymer of the invention can be diluted with the reactive diluent to a concentration of at least 70% by weight. The diluted radiation-curable prepolymer has improved coatability and leveling in addition to having good adhesion.

Accordingly, a radiation-curable resin composition consisting of at least 30% by weight of the radiation-curable prepolymer and not more than 70% by weight of a reactive diluent having a boiling point of at least 200° C. and 1 or 2 polymerizable double bonds per molecule is also one preferred embodiment of the present invention.

Examples of the reactive diluents are those of the following general formulae (I) to (V).

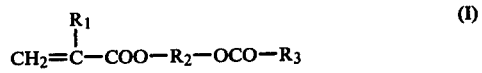

wherein $R_1$ represents a hydrogen atom or a methyl group, $R_2$ represents a glycol residue containing 2 to 10 carbon atoms with the carbon chain of the glycol optionally having an oxygen atom interposed, and $R_3$ represents a phenyl group optionally substituted with an alkyl group containing 1 to 4 carbon atoms.

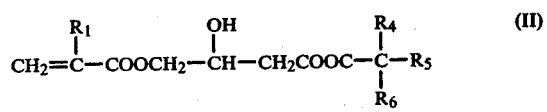

wherein $R_1$ represents a hydrogen atom or a methyl group, and $R_4$, $R_5$ and $R_6$ represent alkyl groups and have 9 to 11 carbon atoms in total.

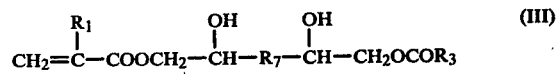

wherein $R_1$ represents a hydrogen atom or a methyl group, $R_7$ represents an alkylene group with 2 to 6 carbon atoms, and $R_3$ represents a phenyl group optionally substituted with an alkyl group containing 1 to 4 carbon atoms.

wherein $R_1$ represents a hydrogen atom or a methyl group, and $R_8$ represents an alkyl or hydroxyalkyl group with 1 to 4 carbon atoms.

wherein $R_1$ represents a hydrogen atom or a methyl group, and $R_2$ represents a glycol residue containing 2 to 10 carbon atoms with the carbon chain of the glycol optionally having an oxygen atom interposed.

A preferred reactive diluent in this invention is a mixture consisting of 30 to 80% by weight of the compound of formula (I), 10 to 35% by weight of the compound of formula (V), and 10 to 35% by weight of a compound of the following formula

wherein $R_3$ represents a phenyl group optionally substituted with an alkyl group having 1 to 4 carbon atoms, and $R_2$ represents a glycol residue containing 2 to 10 carbon atoms with the carbon chain of the glycol optionally having an oxygen atom interposed. It is also possible to use this mixed diluent in conjunction with a non-polymerizable conventional solvent or diluent such as butyl acetate, xylene, ethylene glycol monobutyl ether, and toluene.

The radiation-curable prepolymer and the radiation-curable resin composition containing it may be formed into emulsions in a customary manner to obtain polymerizable emulsions having a lower viscosity and better application properties.

The radiation-curable prepolymer and the radiation-curable resin composition containing it can be cured by exposure to radiation such as ultraviolet light, X-ray, γ-ray and electron beam. When an ultraviolet energy is utilized, the curing may be accelerated by a photoinitiator such as benzoin or its alkyl ether, benzophenone, anthraquinone, polynuclear quinone, disulfide, or benzil. The suitable amount of the photoinitiator is 0.1 to 10 parts by weight per 100 parts by weight of the radiation-curable prepolymer or the radiation-curable resin composition containing it.

Accordingly, an ultraviolet-curable metal coating composition consisting essentially of (1) 100 parts by weight of the radiation-curable prepolymer or radiation-curable resin composition and (2) 0.1 to 10 parts by weight of a photoinitiator, and a method which comprises coating a metal substrate with the radiation-curable prepolymer or radiation-curable resin composition containing it, and exposing the coating to radiation to form a dried coating are also embodiments of the present invention.

The radiation-curable prepolymer and the radiation-curable resin composition have good curability and superior adhesion to substrates, especially metal substrates, and give cured coatings having superior chemical and physical properties.

The following examples specifically illustrate the present invention. It should be noted that these examples are not intended to limit the present invention. Examples A to E relate to the production of intermediates for the radiation-curable prepolymer. Examples 1 to 7 cover the production of the radiation-curable prepolymer, the radiation-curable resin composition, or the polymerizable emulsion of the present invention. Examples 8 to 11 pertain to the production of radiation-curable prepolymers for comparison.

EXAMPLE A (polyester polyol)

480 g (1.5 moles) of bisphenol A adducted with 2 moles of ethylene oxide, 159 g (1.5 moles) of diethylene glycol, 290.5 g (1.75 moles) of isophthalic acid and 145 g (0.25 mole) of dimer acid were reacted at 220° to 230° C. for about 10 hours to afford a polyester polyol having an acid value of less than 5, a hydroxyl equivalent weight of 488 and a number average molecular weight of 976.

EXAMPLE B (polyester polyol)

By the same reacting procedure as used in Example A, 480 g (1.5 moles) of bisphenol A adducted with 2 moles of ethylene oxide, 124.5 g (0.75 mole) of isophthalic acid and 145 g (0.25 mole) of dimer acid were reacted. The resulting polyester polyol had an acid value of less than 5, a hydroxyl equivalent weight of 701, and a number average molecular weight of 1,402.

EXAMPLE C (polyester polyol)

By the same reacting procedure as used in Example A, 480 g (1.5 moles) of bisphenol A adducted with 2 moles of ethylene oxide, 135 g (1 mole) of trimethylol propane, 207.5 g (1.25 moles) of isophthalic acid and 435 g (0.75 mole) of dimer acid were reacted. The resulting polyester polyol has an acid value of less than 5, a hydroxyl equivalent weight of 590 and a number average molecular weight of 2,360.

EXAMPLE D (polyester polyol)

By the same reacting procedure as used in Example A, 480 g (1.5 moles) of bisphenol A adducted with 2 moles of ethylene oxide, 290 g (0.5 mole) of dimer acid and 83 g (0.5 mole) of isophthalic acid were reacted. The resulting polyester polyol had an acid value of less than 5, a hydroxyl equivalent weight of 801 and a number average molecular weight of 1,602.

EXAMPLE E (isocyanate adduct)

222 g (1 mole) of isophorone diisocyanate, 116 g (1 mole) of β-hydroxyethyl acrylate and 0.066 g of hydroquinone as a polymerization inhibitor were charged into a fully dried flask, and reacted under an atmosphere of nitrogen at 65° C. for 8 hours to afford an isocyanate adduct having an isocyanate content of 12.4%.

EXAMPLE 1

A flask was charged with 169 g of the ioscyanate adduct obtained in Example E, 71 g of butyl acetate and 250 g of the polyester polyol obtained in Example A, and they were reacted under an atmosphere of nitrogen at 65° C. for about 11 hours. After confirming that the isocyanate content of the reaction product was less than 0.3%, 4.2 g of methanol was added. The resulting radiation-curable prepolymer had about 1.2 polymerizable double bonds per 1000 of molecular weight or about 2 polymerizable double bonds per molecule.

EXAMPLE 2

The same reacting procedure as used in Example 1 was repeated except that 169 g of the isocyanate adduct obtained in Example E, 250 g of the polyester polyol of Example A, and 213 g of a mixed polymerizable diluent consisting of 50% of neopentyl glycol monobenzoate monoacrylate, 25% of neopentyl glycol diacrylate and 25% of neopentyl glycol dibenzoate were used. After confirming that the isocyanate content of the reaction product was less than 0.2%, 4.2 g of methanol was added. The resulting radiation-curable resin composition contained a radiation-curable prepolymer which had about 2 polymerizable double bonds per molecule or about 1 polymerizable double bond per 1000 of molecular weight.

EXAMPLE 3

The same reacting procedure as in Example 1 was repeated except that 169 g of the isocyanate adduct obtained in Example E, 350 g of the polyester polyol obtained in Example B and 260 g of 1,6-hexanediol diacrylate were used. After confirming that the isocyanate content of the reaction product was less than 0.2%, 5.3 g of methanol was added. The resulting radiation-curable resin composition contained a radiation-curable prepolymer which had about 2 polymerizable double bonds per molecule or about 1 polymerizable double bond per 1000 of molecular weight.

EXAMPLE 4

The same reacting procedure as in Example 1 was repeated except that 169 g of the isocyanate adduct obtained in Example E, 350 g of the polyester polyol obtained in Example B, 130 g of the mixed diluent described in Example 2, and 130 g of 1,6-hexanediol diacrylate were used. After confirming that the isocyanate content of the reaction product was less than 0.2%, 5.3 g of methanol was added. The resulting radiation-curable resin composition contained a radiation-curable prepolymer which had about 2 polymerizable double bonds per molecule or about 1 polymerizable double bond per 1000 of molecular weight.

EXAMPLE 5

The same reacting procedure as in Example 1 was repeated except that 169 g of the isocyanate adduct obtained in Example E, 296 g of the polyester polyol obtained in Example C, 116 g of 1,6-hexanediol diacrylate and 116 g of acrylic acid ester of Cardura E (Cardura E; a trademark for an epoxide produced by Shell Chemical Co.) were used. After confirming that the resulting product had an isocyanate content of less than 0.2%, 4.7 g of methanol was added. The resulting radiation-curable resin composition contained a radiation-curable prepolymer which had 4 polymerizable double bonds per molecule or about 1.1 polymerizable double bonds per 1000 of molecular weight.

EXAMPLE 6

The same reacting procedure as in Example 1 was repeated except that 169 g of the isocyanate adduct obtained in Example E, 400 g of the polyester polyol obtained in Example D and 285 of neopentyl glycol diacrylate were used. After confirming that the resulting product had an isocyanate content of less than 0.2%, 5.7 g of methanol was added. The resulting radiation-curable resin composition contained a radiation-curable prepolymer which had about 2 polymerizable double bonds per molecule or about 0.9 polymerizable double bond per 1000 of molecular weight.

EXAMPLE 7

A reactor was charged with 169 g of the isocyanate adduct obtained in Example E, 48.5 g of the mixed diluent described in Example 2 and 250 g of the polyester polyol obtained in Example A, and they were reacted at about 65° C. for about 11 hours under an atmosphere of nitrogen. After confirming that the resulting product had an isocyanate content of less than 0.3%, 4.2 g of methanol was added.

While the resulting radiation-curable resin composition was maintained at 55° C., 23.6 g of polyethylene glycol alkylaryl ether was added as an emulsifier. With thorough stirring, 92 g of water was added dropwise over the course of 30 minutes. Furthermore, 210 g of water was added dropwise over the course of 1 hour to afford a polymerization emulsion.

EXAMPLE 8 (comparison)

236 g (2 moles) of 1,6-hexanediol, 212 g (2 moles) of diethylene glycol, 135 g (1 mole) of trimethylol propane, 296 g (2 moles) of phthalic anhydride and 332 g (2 moles) of isophthalic acid were reacted at 220° to 230° C. for about 15 hours to afford a polyester polyol having an acid value of less than 5, a hydroxyl equivalent weight of 364 and a number average molecular weight of 1,092.

In a flask, 182 g of the resulting polyester polyol and 62 g of butyl acetate were added to 169 g of the isocyanate adduct obtained in Example E. At 65° C., they were reacted until the product had an isocyanate content of less than 0.3%. Then, 5.3 g of methanol was added to the reaction product. There was obtained a radiation-curable prepolymer containing about 3 polymerizable double bonds per molecule or about 1.4 polymerizable double bonds per 1000 of molecule.

EXAMPLE 9 (comparison)

236 g (2 moles) of 1,6-hexanediol, 318 g (3 moles) of diethylene glycol, 444 g (3 moles) of phthalic anhydride and 146 g (1 mole) of adipic acid were reacted at 220° to 230° C. for about 15 hours to afford a polyester polyol having an acid value of less than 5, a hydroxyl equivalent weight of 534 and a number average molecular weight of 1,068.

In a flask, 270 g of the polyester polyol and 77 g of butyl acetate were added to 169 g of the isocyanate adduct obtained in Example E, and they were reacted at 65° C. for about 11 hours. After confirming that the isocyanate content of the reaction product was 0.3%, 4.4 g of methanol was added. There was obtained a radiation-curable prepolymer containing about 2 polymerizable double bonds per molecule or about 1.15 polymerizable double bonds per 1000 of molecular weight.

EXAMPLE 10 (comparison)

318 g (3 moles) of diethylene glycol, 145 g (0.25 mole) of dimer acid and 290.5 g (1.75 moles) of isophthalic acid were reacted at 220° to 230° C. for about 15 hours to afford a polyester polyol having an acid value of less than 5, a hydroxyl equivalent weight of 335 and a number average molecular weight of 670.

In a flask, 172 g of the resulting polyester polyol and 81 g of butyl acetate were added to 169 g of the isocyanate adduct obtained in Example E, and they were reacted at 65° C. until the isocyanate content of the resulting product became less than 0.3%. Then, 4 g of methanol was added to the reaction product. There was obtained a radiation-curable prepolymer having about 2 polymerizable double bonds per molecule or about 1.5 polymerizable double bonds per 1000 of molecular weight.

EXAMPLE 11 (comparison)

480 g (2 moles) of a 2 mole ethylene oxide adduct of bisphenol A, 159 g (1.5 moles) of diethylene glycol, 290.5 g (1.75 moles) of isophthalic acid and 36.5 g (0.25 mole) of adipic acid were reacted at 220° to 230° C. for about 15 hours to afford a polyester polyol having an acid value of less than 5, a hydroxyl equivalent weight of 440 and a number average molecular weight of 880.

In a flask, 225 g of the resulting polyester polyol and 94 g of butyl acetate were added to 169 g of the isocyanate adduct obtained in Example E. They were reacted at 65° C. until the isocyanate content of the product became less than 0.3%. Then, 4 g of methanol was added to the reaction product. There was obtained a radiation-curable prepolymer containing about 2 polymerizable double bonds per molecule or about 1.3 polymerizable double bonds per 1000 of molecular weight.

EXAMPLE 12 (Application)

100 Parts by weight of each of the radiation-curable prepolymers, radiation-curable resin compositions and radiation-curable emulsion, 4 parts by weight of a 50% methyl ethyl ketone solution of benzophenone, and 4 parts by weight of diisopropanolamine were fully mixed. The mixture was coated to a thickness of 20 to 30 microns on each of the various substrates degreased with petroleum benzine. Each of the coated substrates was carried on a conveyor, and passed once beneath two 4 KW high pressure mercury lamps located 15 cm above the substrate. The speed of the conveyor was 10 m/min. When the polymerizable emulsion (Example 7) was used, the coated substrate was dried at 50° C. for 5 minutes prior to irradiation of UV light.

The cured coatings were tested for the following properties, and the results are tabulated below.

(1) Pencil hardness (JIS-K5400; 6.14)
(2) Impact resistance (JIS-K5400; 6.13.3)
(3) Bending test (JIS-K5400; 6.15)
(4) Adhesion test (crosscut adhesive cellophane tape peeling)

Using a disc record stylus, the coating on the substrate was cut lengthwise and crosswise at intervals of about 1 mm to provide 100 squares each having an area of 1 mm². An adhesive cellophane tape was firmly adhered to the cut coating so as to cover all of these squares. The adhesive cellophane tape was peeled off instantaneously with a strong force, and then the number of squares which remained completely adhering to the substrate was counted. The "adhesion" is expressed by a fraction having the number so counted as a numerator and the total number (100) as a denominator. 100/100 means that the adhesion is the best, and 0/100 means that the adhesion is the worst.

phenol A with the proportion of the oxide added being 2 to 4 moles per mole of bisphenol A.

2. A process for producing the radiation-curable prepolymer of claim 1 which comprises a first step of reacting the organic diisocyanate (A) with the unsaturated monomer (B), the ratio of the number of hydroxyl groups to that of isocyanate groups being 0.4 to 0.7:1; and a second step of reacting the isocyanate-containing product of the first step with the polyester polyol (C) in an amount substantially equal in gram-equivalent weight to the product of the first step.

3. An ultraviolet-curable metal coating composition consisting essentially of (1) 100 parts by weight of the radiation-curable prepolymer of claim 1 and (2) 0.1 to 10 parts by weight of a photoinitiator.

4. A radiation-curable resin composition consisting essentially of at least 30% by weight of the radiation-curable prepolymer of claim 1 and not more than 70% by weight of a reactive diluent containing 1 or 2 polymerizable double bonds per molecule and having a boiling point of at least 200° C.

5. The radiation-curable resin composition of claim 4 wherein the reactive diluent is a mixture consisting of 30

| Example | 1 | 2 | 3 | 4 | 5 | 6 | 7 | 8 (comparison) | 9 (comparison) | 10 (comparison) | 11 (comparison) |
|---|---|---|---|---|---|---|---|---|---|---|---|
| Pencil hardness (tin plate) | H | 2H | 2H | 2H | 2H | H | H | 2H | B | B | 2H |
| Impact resistance, convex | 40 cm above | 20 cm | 40 cm above | 20 cm | 20 cm | above 50 cm above | above 50 cm above | below 10 cm | 20 cm | above 50 cm above | 20 cm |
| concave (tin plate; 300 g) | 50 cm | 40 cm | 50 cm | 40 cm | 40 cm | 50 cm | 50 cm | 10 cm | 40 cm | 50 cm | 30 cm |
| Bending test (tin plate; 2 mm diameter) | Excellent | Excellent | Excellent | Excellent | Excellent | Excellent | Excellent | Very poor | Excellent | Excellent | Poor |
| Adhesion | | | | | | | | | | | |
| Tin plate | 100/100 | 100/100 | 100/100 | 100/100 | 100/100 | 100/100 | 100/100 | 0/100 | 0/100 | 50/100 | 0/100 |
| Aluminum plate | 100/100 | 100/100 | 100/100 | 100/100 | 100/100 | 100/100 | 100/100 | 0/100 | 0/100 | 0/100 | 0/100 |
| Cold rolled steel plate | 100/100 | 100/100 | 100/100 | 100/100 | 100/100 | 100/100 | 100/100 | 0/100 | 0/100 | 20/100 | 0/100 |
| Iron phosphate-treated steel plate | 100/100 | 100/100 | 100/100 | 100/100 | 100/100 | 100/100 | 100/100 | 0/100 | 0/100 | 40/100 | 0/100 |
| Zinc phosphate-treated steel plate | 100/100 | 100/100 | 100/100 | 100/100 | 100/100 | 100/100 | 100/100 | 0/100 | 0/100 | 30/100 | 0/100 |
| Chromium-plated steel plate | 100/100 | 100/100 | 100/100 | 100/100 | 100/100 | 100/100 | 100/100 | 0/100 | 0/100 | 0/100 | 0/100 |

What is claimed is:

1. A substantially NCO-free radiation-curable prepolymer which is the reaction product of (A) an organic diisocyanate with (B) a low-molecular weight hydroxyl-containing unsaturated monomer having both a hydroxyl group and a polymerizable double bond and (C) a polyester polyol containing 2 to 8 hydroxyl groups per molecule, the polyester polyol (C) having a number average molecular weight of 400 to 6,000 and a hydroxyl equivalent weight of 200 to 3,000 and containing a dimer acid residue derived from 9 to 70% based on the weight of the total weight of the starting materials, of dimer acid and an alcohol residue derived from 20 to 75%, based on the total weight of the starting materials, of an ethylene oxide or propylene oxide adduct of bisto 80% by weight of a compound of the general formula

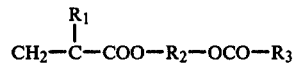

wherein $R_1$ represents a hydrogen atom or a methyl group, $R_2$ represents a glycol residue containing 2 to 10 carbon atoms or a glycol residue containing 2 to 10 carbon atoms with the carbon chain of the glycol having an oxygen atom interposed, and $R_3$ represents a phenyl group or a phenyl group substituted with an alkyl group having 1 to 4 carbon atoms, 10 to 35% by weight of a compound of the general formula $$CH_2=\underset{R_1}{\overset{|}{C}}-COO-R_2-OCO-\underset{R_1}{\overset{|}{C}}=CH_2$$

wherein $R_1$ represents a hydrogen atom or a methyl group, $R_2$ represents a glycol residue containing 2 to 10 carbon atoms or a glycol residue containing 2 to 10 carbon atoms with the carbon chain of the glycol having an oxygen atom interposed and 10 to 35% by weight of a compound of the general formula $$R_3COO-R_2-OCO-R_3$$

wherein $R_3$ represents a phenyl group or a phenyl group substituted with an alkyl group containing 1 to 4 carbon atoms, and $R_2$ represents a glycol residue containing 2 to 10 carbon atoms or a glycol residue containing 2 to 10 carbon atoms with the carbon chain of the glycol having an oxygen atom interposed.

6. An ultraviolet-curable metal coating composition consisting essentially of (1) 100 parts by weight of the resin composition of claim 4 and (2) 0.1 parts by weight of a photoinitiator.

* * * * *